US010636951B2

(12) United States Patent
Kang et al.

(10) Patent No.: US 10,636,951 B2
(45) Date of Patent: Apr. 28, 2020

(54) THERMOPLASTIC RESIN COMPOSITION HAVING EXCELLENT REFLECTIVITY (71) Applicant: Lotte Advanced Materials Co., Ltd., Yeosu-si (KR)

(72) Inventors: Tae Gon Kang, Uiwang-si (KR); Chan Moo Park, Uiwang-si (KR); Yoo Jin Jung, Uiwang-si (KR); Yang Il Kim, Uiwang-si (KR); Tae Soo Kim, Uiwang-si (KR); Sang Hyun Hong, Uiwang-si (KR)

(73) Assignee: Lotte Advanced Materials Co., Ltd., Yeosu-si (KR)

( * ) Notice: Subject to any disclaimer, the term of this patent is extended or adjusted under 35 U.S.C. 154(b) by 147 days.

(21) Appl. No.: 14/748,879

(22) Filed: Jun. 24, 2015

(65) Prior Publication Data

US 2015/0376400 A1   Dec. 31, 2015

(30) Foreign Application Priority Data

Jun. 27, 2014 (KR) .................. 10-2014-0079516
Jun. 3, 2015 (KR) .................. 10-2015-0078825

(51) Int. Cl.
| *H01L 33/60* | (2010.01) |
| *C08L 67/02* | (2006.01) |
| *C08L 51/06* | (2006.01) |
| *C08L 51/08* | (2006.01) |
| *C08K 3/013* | (2018.01) |
| *C08K 7/14* | (2006.01) |
| *C08L 23/08* | (2006.01) |
| *H01L 33/56* | (2010.01) |

(52) U.S. Cl.
CPC .............. *H01L 33/60* (2013.01); *C08K 3/013* (2018.01); *C08K 7/14* (2013.01); *C08L 23/0869* (2013.01); *C08L 51/06* (2013.01); *C08L 51/085* (2013.01); *C08L 67/02* (2013.01); *C08L 2203/20* (2013.01); *H01L 33/56* (2013.01); *H01L 2224/48091* (2013.01)

(58) Field of Classification Search
CPC ...... C08L 67/02; C08L 23/0869; C08L 51/06; C08L 51/085; C08L 2203/20; C08K 3/0033; C08K 7/14; C08K 3/22; C08K 3/346; C08K 2003/2241; H01L 2224/48091; H01L 2924/00012; H01L 33/56; H01L 33/60; H01L 2933/0033; H01L 2933/0058

See application file for complete search history.

(56) References Cited

U.S. PATENT DOCUMENTS

| 4,006,272 | A | 2/1977 | Sakaguchi et al. |
| 4,027,073 | A | 5/1977 | Clark |
| 4,034,013 | A | 7/1977 | Lane |
| 4,045,514 | A | 8/1977 | Iwahashi et al. |
| 4,139,600 | A | 2/1979 | Rollmann et al. |
| 4,177,185 | A | 12/1979 | Tacke et al. |
| 4,180,494 | A | 12/1979 | Fromuth et al. |
| 4,185,044 | A | 1/1980 | Tacke et al. |
| 4,287,315 | A | 9/1981 | Meyer et al. |
| 4,303,772 | A | 12/1981 | Novicky |
| 4,393,153 | A | 7/1983 | Hepp |
| 4,400,333 | A | 8/1983 | Neefe |
| 4,639,480 | A | 1/1987 | Birum |
| 4,664,983 | A | 5/1987 | Nakamura et al. |
| 4,694,031 | A | 9/1987 | Morita et al. |
| 4,745,029 | A | 5/1988 | Kambour |
| 4,753,980 | A | 6/1988 | Deyrup |
| 4,788,251 | A | 11/1988 | Brown et al. |
| 4,803,235 | A | 2/1989 | Okada |
| 4,900,610 | A | 2/1990 | Hochberg et al. |
| 4,906,202 | A | 3/1990 | Germ |
| 4,906,696 | A | 3/1990 | Fischer et al. |
| 4,990,549 | A | 2/1991 | Delvin et al. |
| 5,025,066 | A | 6/1991 | DeRudder et al. |
| 5,061,558 | A | 10/1991 | Fischer et al. |
| 5,068,285 | A | 11/1991 | Laughner |

(Continued)

FOREIGN PATENT DOCUMENTS

| CN | 1285858 A | 2/2001 |
| CN | 1376182 A | 10/2002 |

(Continued)

OTHER PUBLICATIONS

Office Action in counterpart Chinese Application No. 201510359435.X dated Jun. 17, 2016, pp. 1-7.
European Search Report in commonly owned European Application No. 08862371 dated Dec. 7, 2010, pp. 1-6.
International Search Report in commonly owned International Application No. PCT/KR2008/006870, dated May 28, 2009, pp. 1-2.
Office Action in commonly owned U.S. Appl. No. 12/631,018 dated Nov. 8, 2011, pp. 1-10.
Chinese Office Action in commonly owned Chinese Application No. 200910211954 dated Jun. 23, 2011, pp. 1-5.
English translation of Chinese Office Action in commonly owned Chinese Application No. 200910211954 dated Jun. 23, 2011, pp. 1-5.

(Continued)

*Primary Examiner* — Ling Siu Choi
*Assistant Examiner* — Gennadiy Mesh
(74) *Attorney, Agent, or Firm* — Additon, Higgins & Pendleton, P.A.

(57) ABSTRACT

A thermoplastic resin composition includes: a polyester resin; a white pigment; a core-shell structured impact modifier; and a modified polyolefin resin. Exemplary compositions include polycyclohexylenedimethylene terephthalate; titanium oxide; a core-shell structured impact modifier wherein the core includes a silicon and/or acrylic compound and the shell includes an acrylic compound; and a copolymer of ethylene and an alkyl (meth)acrylate comonomer. The thermoplastic resin composition and a molded article formed from the same can exhibit excellent properties in terms of reflectance, reflectance maintenance at high temperature, and/or flexural strength.

10 Claims, 1 Drawing Sheet

(56) References Cited

U.S. PATENT DOCUMENTS

| | | |
|---|---|---|
| 5,124,402 A | 6/1992 | Laughner et al. |
| 5,189,091 A | 2/1993 | Laughner |
| 5,200,492 A | 4/1993 | Ohnaga et al. |
| 5,219,915 A | 6/1993 | McKee et al. |
| 5,242,967 A | 9/1993 | Minnick |
| 5,256,718 A | 10/1993 | Yamamoto et al. |
| 5,280,070 A | 1/1994 | Drzewinski et al. |
| 5,284,916 A | 2/1994 | Drzewinski |
| 5,292,809 A | 3/1994 | Drzewinski et al. |
| 5,308,894 A | 5/1994 | Laughner |
| 5,369,154 A | 11/1994 | Laughner |
| 5,382,628 A | 1/1995 | Stewart et al. |
| 5,441,997 A | 8/1995 | Walsh et al. |
| 5,449,557 A | 9/1995 | Liebler et al. |
| 5,470,658 A | 11/1995 | Gasca et al. |
| 5,529,716 A | 6/1996 | Nomura et al. |
| 5,841,088 A | 11/1998 | Yamaguchi et al. |
| 5,849,380 A | 12/1998 | Kashiba et al. |
| 5,863,974 A | 1/1999 | Tjahjadi et al. |
| 6,060,538 A | 5/2000 | Gallucci |
| 6,238,732 B1 | 5/2001 | Cameron et al. |
| 6,252,002 B1 | 6/2001 | Yamada et al. |
| 6,277,905 B1 | 8/2001 | Keep |
| 6,310,129 B1 | 10/2001 | Lilly et al. |
| 6,486,251 B1 | 11/2002 | Patel |
| 6,506,830 B1 | 1/2003 | Bussi et al. |
| 6,545,089 B1 | 4/2003 | DeRudder et al. |
| 6,646,068 B2 | 11/2003 | Chisholm et al. |
| 6,653,391 B1 | 11/2003 | Weber et al. |
| 7,009,029 B2 | 3/2006 | Oka et al. |
| 7,294,659 B2 | 11/2007 | Yatake |
| 7,385,013 B2 | 6/2008 | Kobayashi et al. |
| 7,671,143 B2 | 3/2010 | Lee et al. |
| 7,732,515 B2 | 6/2010 | Jang et al. |
| 7,960,464 B2 | 6/2011 | Kobayashi et al. |
| 8,044,134 B2 | 10/2011 | Chung et al. |
| 8,044,143 B2 | 10/2011 | Park et al. |
| 8,178,608 B2 | 5/2012 | Nakamura et al. |
| 8,304,481 B2 | 11/2012 | Nakamura et al. |
| 8,426,549 B2 | 4/2013 | Ogasawara |
| 8,815,993 B2 | 8/2014 | Kim et al. |
| 8,933,158 B2 | 1/2015 | Shiobara et al. |
| 9,062,198 B2 | 6/2015 | Lu |
| 9,187,621 B2 | 11/2015 | Lu |
| 9,437,790 B2 | 9/2016 | Kim et al. |
| 2002/0042483 A1 | 4/2002 | Vanderbilt |
| 2002/0111409 A1 | 8/2002 | Talibuddin |
| 2003/0032725 A1 | 2/2003 | Gaggar et al. |
| 2004/0102604 A1 | 5/2004 | Bassler et al. |
| 2004/0175466 A1 | 9/2004 | Douglas et al. |
| 2005/0113532 A1 | 5/2005 | Fish, Jr. et al. |
| 2005/0159533 A1 | 7/2005 | Nabeshima et al. |
| 2005/0165207 A1 | 7/2005 | Agarwal et al. |
| 2005/0239949 A1 | 10/2005 | Nakamura et al. |
| 2006/0004154 A1 | 1/2006 | DeRudder et al. |
| 2006/0030647 A1 | 2/2006 | Ebeling et al. |
| 2006/0051587 A1 | 3/2006 | Mori et al. |
| 2006/0100307 A1 | 5/2006 | Uerz et al. |
| 2006/0135690 A1 | 6/2006 | Juikar et al. |
| 2007/0155913 A1 | 7/2007 | Chakravarti et al. |
| 2007/0161741 A1 | 7/2007 | Ogasawara |
| 2007/0213458 A1* | 9/2007 | Topoulos .................. G02B 1/04 524/601 |
| 2007/0265371 A1 | 11/2007 | Takahashi et al. |
| 2007/0282056 A1 | 12/2007 | Schellekens et al. |
| 2008/0009571 A1 | 1/2008 | Pixton et al. |
| 2008/0146718 A1 | 6/2008 | Gijsman et al. |
| 2008/0153954 A1 | 6/2008 | Arpin |
| 2008/0242789 A1 | 10/2008 | Zhu et al. |
| 2009/0069479 A1 | 3/2009 | Seki |
| 2009/0080079 A1 | 3/2009 | Kogure et al. |
| 2009/0118402 A1 | 5/2009 | Jang et al. |
| 2009/0143267 A1 | 6/2009 | Zhang et al. |
| 2009/0209696 A1 | 8/2009 | Lee et al. |
| 2009/0215934 A1 | 8/2009 | Nakamura et al. |
| 2009/0253847 A1 | 10/2009 | Komatsu et al. |
| 2009/0275678 A1 | 11/2009 | Kumazawa et al. |
| 2010/0029855 A1 | 2/2010 | Matsuoka et al. |
| 2010/0113648 A1 | 5/2010 | Niessner et al. |
| 2010/0113656 A1 | 5/2010 | Saga |
| 2010/0152357 A1 | 6/2010 | Kwon et al. |
| 2010/0160529 A1 | 6/2010 | Lee et al. |
| 2010/0160532 A1 | 6/2010 | Park et al. |
| 2010/0168272 A1 | 7/2010 | Park et al. |
| 2010/0197827 A1 | 8/2010 | Kim et al. |
| 2010/0227957 A1 | 9/2010 | Fujii |
| 2010/0240831 A1 | 9/2010 | Kim et al. |
| 2010/0256288 A1 | 10/2010 | Kim et al. |
| 2011/0009524 A1 | 1/2011 | Kwon et al. |
| 2011/0021677 A1 | 1/2011 | Kwon et al. |
| 2011/0040019 A1 | 2/2011 | Kwon et al. |
| 2011/0160380 A1 | 6/2011 | Kwon et al. |
| 2011/0310622 A1 | 12/2011 | Topoulos |
| 2012/0065318 A1 | 3/2012 | Park et al. |
| 2012/0129989 A1 | 5/2012 | Kim et al. |
| 2012/0165448 A1 | 6/2012 | Lee et al. |
| 2012/0264871 A1* | 10/2012 | Moon .................. C08F 283/12 524/537 |
| 2012/0305287 A1 | 12/2012 | Ni |
| 2012/0329938 A1 | 12/2012 | Kim et al. |
| 2013/0005875 A1 | 1/2013 | Shoji et al. |
| 2013/0158184 A1 | 6/2013 | Topoulos |
| 2013/0172453 A1 | 7/2013 | Lee et al. |
| 2013/0217830 A1 | 8/2013 | Crawford et al. |
| 2013/0281587 A1 | 10/2013 | Shim et al. |
| 2014/0167088 A1* | 6/2014 | Lu .......................... H01L 33/60 257/98 |
| 2014/0167091 A1 | 6/2014 | Ogasawara et al. |
| 2014/0187662 A1 | 7/2014 | Lee et al. |
| 2014/0187700 A1 | 7/2014 | Lee et al. |
| 2014/0309356 A1 | 10/2014 | Kim et al. |
| 2014/0350163 A1 | 11/2014 | Kim et al. |
| 2017/0037240 A1 | 2/2017 | Kim et al. |

FOREIGN PATENT DOCUMENTS

| | | |
|---|---|---|
| CN | 101550282 A | 10/2009 |
| CN | 101560325 A | 10/2009 |
| CN | 101597423 A | 12/2009 |
| CN | 101747602 A | 6/2010 |
| CN | 102725349 A | 10/2012 |
| CN | 102838849 A | 12/2012 |
| CN | 103270114 A | 8/2013 |
| CN | 103910979 A | 7/2014 |
| CN | 103911000 A | 7/2014 |
| DE | 19845317 A1 | 4/2000 |
| DE | 69829099 T2 | 12/2005 |
| DE | 10 2013 226 703 A1 | 7/2014 |
| EP | 0033393 A2 | 8/1981 |
| EP | 0114288 A2 | 8/1984 |
| EP | 0180417 A2 | 5/1986 |
| EP | 0246620 A2 | 5/1987 |
| EP | 0376616 A2 | 7/1990 |
| EP | 0528462 A1 | 2/1993 |
| EP | 0787769 A2 | 8/1997 |
| EP | 1010725 A2 | 6/2000 |
| EP | 1147812 A1 | 10/2001 |
| EP | 2204412 A1 | 7/2010 |
| JP | 53-134799 A | 11/1978 |
| JP | 57-125241 A | 8/1982 |
| JP | 58-196250 A | 11/1983 |
| JP | 62-268612 A | 11/1987 |
| JP | 04-023856 A | 1/1992 |
| JP | 04-359954 A | 12/1992 |
| JP | 05-005055 | 1/1993 |
| JP | 05-098136 A | 4/1993 |
| JP | 05-125260 A | 5/1993 |
| JP | 05-194829 | 8/1993 |
| JP | 06-122771 A | 5/1994 |
| JP | 06-136212 A | 5/1994 |
| JP | 1994-200132 A | 7/1994 |
| JP | 06-313089 A | 11/1994 |
| JP | 07-026101 | 1/1995 |
| JP | 1995-228776 | 8/1995 |

(56) References Cited

FOREIGN PATENT DOCUMENTS

| | | |
|---|---|---|
| JP | 10-060241 A | 3/1998 |
| JP | 10-060242 A | 3/1998 |
| JP | 10-219026 A | 8/1998 |
| JP | 11-129246 A | 5/1999 |
| JP | 11-171984 A | 6/1999 |
| JP | 11-181168 A | 7/1999 |
| JP | 11-279385 | 10/1999 |
| JP | 2000-063641 A | 2/2000 |
| JP | 2000-204244 A | 7/2000 |
| JP | 2000-264959 A | 9/2000 |
| JP | 2000-265001 A | 9/2000 |
| JP | 2000-327992 | 11/2000 |
| JP | 2001-049072 A | 2/2001 |
| JP | 2002-001125 A | 1/2002 |
| JP | 2002-080676 A | 3/2002 |
| JP | 2002-201344 A | 7/2002 |
| JP | 2002-294070 A | 10/2002 |
| JP | 2003-525335 | 8/2003 |
| JP | 2003-313392 | 11/2003 |
| JP | 2004-075994 A | 3/2004 |
| JP | 4325753 A | 12/2004 |
| JP | 4915155 A | 12/2004 |
| JP | 2005-097462 A | 4/2005 |
| JP | 2005-220173 A | 8/2005 |
| JP | 2006-249292 A | 9/2006 |
| JP | 2006-257284 A | 9/2006 |
| JP | 2006-342246 A | 12/2006 |
| JP | 2007-077222 | 3/2007 |
| JP | 2007-084952 A | 4/2007 |
| JP | 2007-218980 | 8/2007 |
| JP | 2008-013702 A | 1/2008 |
| JP | 2008-505233 A | 2/2008 |
| JP | 2009-507990 A1 | 2/2009 |
| JP | 2009-173015 A | 8/2009 |
| JP | 2009-263640 A | 11/2009 |
| JP | 2011-094026 A | 5/2011 |
| JP | 2013-251510 A | 12/2013 |
| JP | 2014-148615 A | 8/2014 |
| KR | 10-1999-0018287 | 3/1993 |
| KR | 1996-0007611 B1 | 6/1996 |
| KR | 10-1998-0004915 | 6/1998 |
| KR | 10-1998-027070 | 7/1998 |
| KR | 1998-055579 | 9/1998 |
| KR | 10-1999-0029495 A | 4/1999 |
| KR | 10-1999-0054644 | 7/1999 |
| KR | 10-2000-0038719 A | 7/2000 |
| KR | 10-2000-0048033 A | 7/2000 |
| KR | 10-2001-0032100 A | 4/2001 |
| KR | 10-2001-0070975 A | 7/2001 |
| KR | 2004-0079118 A | 9/2004 |
| KR | 10-2005-0032100 A | 4/2005 |
| KR | 10-0514272 B | 9/2005 |
| KR | 10-2005-0109049 A | 11/2005 |
| KR | 10-0581437 B | 5/2006 |
| KR | 10-2006-0135649 A | 12/2006 |
| KR | 10-0709878 B1 | 4/2007 |
| KR | 10-2007-0070686 A | 7/2007 |
| KR | 10-2007-0072372 A | 7/2007 |
| KR | 10-2007-0072375 A | 7/2007 |
| KR | 10-2007-0093994 A | 9/2007 |
| KR | 10-0767428 A1 | 10/2007 |
| KR | 2007-7026437 A | 12/2007 |
| KR | 10-2008-0062975 A | 7/2008 |
| KR | 10-2008-0063054 A | 7/2008 |
| KR | 10-0871436 B1 | 11/2008 |
| KR | 10-2009-0030511 A | 3/2009 |
| KR | 10-0886348 B1 | 3/2009 |
| KR | 10-2010-0071715 | 6/2010 |
| KR | 10-2011-0078044 A | 7/2011 |
| KR | 10-2012-0066740 A | 6/2012 |
| KR | 10-2012-0140332 A | 12/2012 |
| KR | 10-2013-0076027 A | 7/2013 |
| KR | 10-2013-0076733 A | 7/2013 |
| KR | 10-2013-0116813 A | 10/2013 |
| KR | 10-2014-0075517 A | 6/2014 |
| TW | 201306319 A | 2/2013 |
| TW | 201343743 A | 11/2013 |
| TW | 201343777 A | 11/2013 |
| WO | 02/088044 A1 | 11/2002 |
| WO | 2003/085029 A1 | 10/2003 |
| WO | 2005/075554 A1 | 8/2005 |
| WO | 2007/119920 A1 | 10/2007 |
| WO | 2007/140101 A1 | 12/2007 |
| WO | 2008/039017 A1 | 4/2008 |
| WO | 2008/081791 A1 | 7/2008 |
| WO | 2009/078593 A1 | 6/2009 |
| WO | 2009/078602 A1 | 6/2009 |
| WO | 2009/113762 A2 | 9/2009 |
| WO | 2009/116722 A1 | 9/2009 |
| WO | 2009/128601 A1 | 10/2009 |
| WO | 2010/143796 A1 | 12/2010 |
| WO | 2011/013882 A1 | 2/2011 |
| WO | 2012/081801 A1 | 6/2012 |
| WO | 2013/100578 A1 | 7/2013 |
| WO | 2013/101277 A1 | 7/2013 |
| WO | 2013125453 A | 8/2013 |
| WO | 2013/129201 A1 | 9/2013 |
| WO | 2014/095648 A1 | 6/2014 |
| WO | 2015/102177 A1 | 7/2015 |

OTHER PUBLICATIONS

Katrizky et al., "Correlation and Prediction of the Refractive Indices of Polymers by QSPR", Journal of Chemical Information and Computer Sciences, pp. 1711-1176, (1998).
Office Action in commonly owned U.S. Appl. No. 12/642,904 dated Dec. 14, 2011, pp. 1-9.
European Search Report in commonly owned European Application No. 09180634 dated Feb. 2, 2010, pp. 1-3.
Xu, "Predicition of Refractive Indices of Linear Polymers by a four-descriptor QSPR model", Polymer, 45 (2004) pp. 8651-8659.
European Search Report in commonly owned European Application No. 10196806 dated Apr. 27, 2011, pp. 1-5.
European Search Report in commonly owned European Application No. 08873425.6 dated May 29, 2012, pp. 1-5.
International Search Report in commonly owned International Application No. PCT/KR2008/007157, dated May 28, 2009, pp. 1-2.
Office Action in commonly owned U.S. Appl. No. 12/792,176 dated Nov. 16, 2011, pp. 1-12.
International Search Report in commonly owned International Application No. PCT/KR2008/007825, dated Aug. 28, 2009, pp. 1-2.
Office Action in commonly owned U.S. Appl. No. 12/880,209 dated Feb. 16, 2011, pp. 1-10.
Final Office Action in commonly owned U.S. Appl. No. 12/880,209 dated Jul. 29, 2011, pp. 1-9.
Advisory Action in commonly owned U.S. Appl. No. 12/880,209 dated Nov. 4, 2011, pp. 1-4.
International Search Report in commonly owned International Application No. PCT/KR2008/007820 dated Jul. 28, 2009, pp. 1-2.
Final Office Action in commonly owned U.S. Appl. No. 12/792,176 dated Apr. 19, 2012, pp. 1-10.
International Search Report in commonly owned International Application No. PCT/KR2009/007944 dated Aug. 13, 2010, pp. 1-6.
Full English Translation of JP 04-359953, pp. 1-10.
Full English Translation of JP 04-359954, pp. 1-8.
International Search Report in commonly owned International Application No. PCT/KR2012/011485 dated Apr. 16, 2013, pp. 1-4.
Poly(cyclohexanedimethylene terephthalate), pp. 1-2, obtained online from http://www.polymerprocessing.com/polymers/PCT.html. No publication date given.
Office Action in commonly owned U.S. Appl. No. 14/367,416 dated Oct. 20, 2014, pp. 1-27.
Office Action in counterpart Korean Application No. 10-2015-0078825 dated Mar. 29, 2017, pp. 1-6.
Office Action in commonly owned Korean Application No. 10-2015-0093747 dated Apr. 14, 2017, pp. 1-6.
Office Action in commonly owned Chinese Patent Application No. 201610520653.1 dated May 19, 2017, pp. 1-7.

(56) References Cited

OTHER PUBLICATIONS

Office Action in commonly owned U.S. Appl. No. 15/195,128 dated Jun. 14, 2017, pp. 1-11.
Turner et al., "Cyclohexanedimethanol Polyesters", 2001, pp. 127-134.
International Search Report in commonly owned International Application No. PCT/KR2014/005080 dated Sep. 26, 2014, pp. 1-4.
Office Action in commonly owned U.S. Appl. No. 15/107,210 dated Sep. 18, 2017, pp. 1-9.
Office Action in commonly owned Chinese Application No. 201480071500.2 dated Jan. 25, 2017, pp. 1-7.
Taiwanese Office Action in commonly owned Taiwanese Application No. 96136059 dated May 5, 2011, pp. 1-9.
English Translation of Taiwanese Office Action in commonly owned Taiwanese Application No. 96136059 dated May 5, 2011, pp. 1-5.
European Search Report in commonly owned European Application No. 07808474 dated Sep. 28, 2011, pp. 1-4.
International Preliminary Report on Patentability in commonly owned International Application No. PCT/KR2007/004743, dated Mar. 31, 2009, pp. 1-5.
International Search Report in commonly owned International Application No. PCT/KR2007/004743, dated Jan. 4, 2008, pp. 1-2.
Office Action in commonly owned U.S. Appl. No. 12/413,630 dated Jun. 23, 2009, pp. 1-9.
Final Office Action in commonly owned U.S. Appl. No. 12/413,630 dated Dec. 7, 2009, pp. 1-9.
Advisory Action in commonly owned U.S. Appl. No. 12/413,630 dated Apr. 9, 2010, pp. 1-3.
French Search Report and Written Opinion in commonly owned French Application No. 0959193 dated May 27, 2010, pp. 1-5.
Office Action in commonly owned U.S. Appl. No. 12/640,343 dated Aug. 29, 2011, pp. 1-7.
Office Action in commonly owned U.S. Appl. No. 12/640,343 dated Feb. 22, 2012, pp. 1-13.
Final Office Action in commonly owned U.S. Appl. No. 12/640,343 dated Jun. 5, 2012, pp. 1-12.
Office Action in commonly owned U.S. Appl. No. 12/641,752 dated Jan. 10, 2011, pp. 1-10.
Notice of Allowance in commonly owned U.S. Appl. No. 12/641,752 dated Jul. 20, 2011, pp. 1-9.
International Search Report in commonly owned International Application No. PCT/KR2009/007917 dated Aug. 24, 2010, pp. 1-9.
English-translation of Abstract for Korean Publication No. 1998-055579, published Sep. 25, 1998, pp. 1.
Igranox 1076, SpecialChem, Ciba, now part of BASF, 2012 Retrieved online<http://www.specialchem4adhesives.com>, pp. 1.
Office Action in commonly owned U.S. Appl. No. 13/362,068 dated Apr. 6, 2012, pp. 1-24.
Chinese Search Report in commonly owned Chinese Application No. 200980159831.0 dated Dec. 17, 2012, pp. 1-2.
Office Action in commonly owned U.S. Appl. No. 13/300,746 dated Jul. 31, 2013, pp. 1-14.
Advisory Action in commonly owned U.S. Appl. No. 13/300,746 dated Mar. 22, 2013, pp. 1-7.
Office Action in commonly owned U.S. Appl. No. 13/300,746 dated Apr. 9, 2012, pp. 1-19.
Office Action in commonly owned U.S. Appl. No. 13/300,746 dated Sep. 11, 2012, pp. 1-20.
Final Office Action in commonly owned U.S. Appl. No. 13/300,746 dated Jan. 3, 2013, pp. 1-14.
Final Office Action in commonly owned U.S. Appl. No. 13/300,746 dated Jan. 8, 2013, pp. 1-14.
Office Action in commonly owned U.S. Appl. No. 14/367,416 dated Mar. 4, 2015, pp. 1-35.
Full Translation of Higuchi et al. JP 2007-218980, pp. 1-32.
Office Action in commonly owned U.S. Appl. No. 13/728,177 dated Oct. 23, 2013, pp. 1-7.
Office Action in commonly owned U.S. Appl. No. 13/728,177 dated Feb. 10, 2014, pp. 1-13.
Office Action in commonly owned U.S. Appl. No. 13/332,788 dated Nov. 28, 2012, pp. 1-8.
Final Office Action in commonly owned U.S. Appl. No. 13/332,788 dated Jul. 25, 2013, pp. 1-12.
Office Action in commonly owned U.S. Appl. No. 14/067,139 dated May 22, 2014, pp. 1-8.
International Search Report in commonly owned International Application No. PCT/KR2011/006328 dated Apr. 4, 2012, pp. 1-4.
Office Action in commonly owned U.S. Appl. No. 13/915,655 dated Mar. 5, 2014, pp. 1-7.
Notice of Allowance in commonly owned U.S. Appl. No. 13/728,177 dated May 30, 2014, pp. 1-5.
Final Office Action in commonly owned U.S. Appl. No. 13/915,655 dated Jun. 23, 2014, pp. 1-5.
Notice of Allowance in commonly owned U.S. Appl. No. 13/915,655 dated Oct. 15, 2014, pp. 1-7.
Office Action in commonly owned Korean Application No. 10-2014-0182421 dated Jan. 26, 2017, pp. 1-5.
Wypych, "2.1.67 Wollastonite," Handbook of Fillers, 3d Ed., pp. 151-152, Toronto, Ontario: ChemTec Publishing (2010).
Office Action in commonly owned Korean Application No. 10-2014-0138130 dated Nov. 16, 2016, pp. 1-5.
Office Action in commonly owned U.S. Appl. No. 14/971,348 dated Apr. 14, 2017, pp. 1-15.
Office Action in commonly owned Chinese Application No. 201510633614.8 dated Dec. 12, 2016, pp. 1-7.
Office Action in commonly owned U.S. Appl. No. 14/044,906 dated Sep. 15, 2014, pp. 1-6.
Notice of Allowance in commonly owned U.S. Appl. No. 14/044,906 dated Dec. 29, 2014, pp. 1-6.
Office Action in commonly owned U.S. Appl. No. 13/332,736, dated Sep. 17, 2013, pp. 1-7.
Notice of Allowance in commonly owned U.S. Appl. No. 13/332,736 dated Apr. 17, 2014, pp. 1-8.
Office Action in commonly owned U.S. Appl. No. 14/102,535 dated Sep. 26, 2014, pp. 1-8.
Office Action in commonly owned U.S. Appl. No. 14/552,765 dated Sep. 26, 2016, pp. 1-8.
Office Action in commonly owned Taiwanese Application No. 104132047 dated Jun. 4, 2016, pp. 1-7.
Office Action in commonly owned U.S. Appl. No. 14/862,467 dated Nov. 8, 2016, pp. 1-8.
Office Action in commonly owned U.S. Appl. No. 14/552,765 dated May 10, 2017, pp. 1-8.
Office Action in commonly owned German Application No. 102014224495.1 dated Feb. 15, 2017, pp. 1-8.
Office Action in commonly owned Chinese Application No. 201510946837.X dated Mar. 3, 2017, pp. 1-10.
Final Office Action in commonly owned U.S. Appl. No. 14/862,467 dated May 30, 2017, pp. 1-13.
Office Action in commonly owned Japanese Application No. 2016-543678 dated Dec. 26, 2017, pp. 1-4.
Office Action in commonly owned Japanese Application No. 2014-242031 dated May 1, 2018, pp. 1-5.
Office Action in commonly owned U.S. Appl. No. 14/971,348 dated Mar. 8, 2019, pp. 1-10.
Devaney, R., "The structure and electrical properties of poly(1,4-cyclohexylenedimethylene terephthalate), a new linear thermoplastic polyester," National Academy of Sciences—National Research Council, vol. 1080, pp. 32-35 (Year 1963).
Office Action in commonly owned U.S. Appl. No. 15/107,210 dated Jan. 13, 2020, pp. 1-9.

* cited by examiner

THERMOPLASTIC RESIN COMPOSITION HAVING EXCELLENT REFLECTIVITY

CROSS-REFERENCE TO RELATED APPLICATION

This application claims priority under 35 USC Section 119 to and the benefit of Korean Patent Application 10-2014-0079516, filed on Jun. 27, 2014, and Korean Patent Application 10-2015-0078825, filed on Jun. 3, 2015, the entire disclosure of each of which is incorporated herein by reference.

FIELD OF THE INVENTION

The present invention relates to a thermoplastic resin composition.

BACKGROUND

Light emitting diodes (LEDs) and organic light emitting diodes (OLEDs) are rapidly replacing existing light sources and are a focus of attention due to outstanding energy efficiency and long lifespan thereof. Generally, light emitting diodes form a light emitting diode package together with components such as a reflector, a reflector cup, a scrambler, and a housing so as to maximize optical efficiency through high reflectance. Such components are required to withstand high temperature while minimizing deterioration in reflectance and whiteness due to yellowing.

As engineering plastics, polyester resins, copolymers thereof, and blends thereof exhibit useful properties and are thus used in various fields including interior/exterior materials for products. Particularly, polyester resins are used as a material for such components. Examples of polyester resins mainly used as a material for the components include highly heat-resistant polyester resins. However, highly heat-resistant polyester resins have problems of low crystallization rate, low mechanical strength, and poor impact resistance, although the highly heat-resistant polyester resins do not suffer from deformation at high temperature and exhibit good discoloration resistance.

To overcome these problems, typically, additives such as inorganic fillers have been added to the polyester resins to enhance mechanical strength and impact resistance. However, when an excess of additives such as inorganic fillers is used, there is a concern of deterioration in moldability, such as bleed-out.

A polyester resin composition has been developed wherein a polyolefin copolymer is included in a polyester resin to enhance discoloration resistance and impact resistance. However, such a polyester resin composition also has problems of low crystallization rate, poor moldability and molding stability, and insufficient mechanical properties.

Therefore, there is a need for a thermoplastic resin composition which has excellent mechanical properties in terms of reflectance, reflectance maintenance at high temperature, and flexural strength without suffering the above problems, and can thus be used for components for light emitting diodes.

SUMMARY

Exemplary embodiments provide a thermoplastic resin composition that can have excellent properties in terms of reflectance, reflectance maintenance at high temperature, and/or flexural strength, and a molded article formed from the same.

In exemplary embodiments, the thermoplastic resin composition includes: a polyester resin; a white pigment; a core-shell structured impact modifier; and a modified polyolefin resin.

In exemplary embodiments, the thermoplastic resin composition may include about 0.01 parts by weight to about 15 parts by weight of the core-shell structured impact modifier and about 0.01 parts by weight to about 10 parts by weight of the modified polyolefin resin based on about 100 parts by weight of a base resin including the polyester resin and the white pigment, wherein the weight ratio of the polyester resin to the white pigment may range from about 0.1:1 to about 10:1.

In exemplary embodiments, the polyester resin may include a repeat unit represented by Formula 1:

[Formula 1]

wherein Ar is a $C_6$ to $C_{18}$ arylene group, $R_1$ and $R_3$ are the same or different and are each independently a $C_1$ to $C_{10}$ linear alkylene group, and $R_2$ is a $C_3$ to $C_{12}$ cyclic alkylene group.

In exemplary embodiments, the white pigment may include at least one of titanium oxide, zinc oxide, zinc sulfide, white lead, zinc sulfate, barium sulfate, calcium carbonate, and/or alumina.

In exemplary embodiments, the core-shell structured impact modifier may include at least one of an acrylic compound and/or a silicon compound as a core component.

In exemplary embodiments, the modified polyolefin resin may include a copolymer of a monomer mixture including an olefin and a comonomer including at least one oxygen atom capable of forming a copolymer together with the olefin.

In exemplary embodiments, the comonomer may include at least one of (meth)acrylic acid, methyl (meth)acrylate, ethyl (meth)acrylate, butyl (meth)acrylate, hexyl (meth)acrylate, dodecyl (meth)acrylate, cyclohexyl (meth)acrylate, glycidyl (meth)acrylate, benzyl (meth)acrylate, vinyl acetate, and/or vinyl alcohol.

In exemplary embodiments, the modified polyolefin resin may include the olefin in an amount of about 40 wt % to about 99 wt % based on the total weight of the modified polyolefin resin.

In exemplary embodiments, the base resin may further include inorganic fillers.

In exemplary embodiments, the inorganic fillers may be present in an amount of about 1 wt % to about 40 wt % based on the total weight of the base resin.

In exemplary embodiments, the inorganic fillers may include at least one of glass fibers, carbon fibers, glass beads, glass flakes, carbon black, clay, kaolin, talc, mica, and/or wollastonite.

In exemplary embodiments, the weight ratio of the core-shell structured impact modifier to the modified polyolefin resin may range from about 0.05:1 to about 20:1.

Other exemplary embodiments of the present invention relate to a molded article. The molded article is formed from the thermoplastic resin composition as set forth above.

In exemplary embodiments, the molded article may have a difference in reflectance of about less than 15, as measured before/after light irradiation (LED light source, wavelength of about 450 nm) in a constant temperature/humidity oven at about 170° C. and about 85% relative humidity (RH) for about 1,000 hours, and a flexural strength at break point of about 20 N to about 80 N, as measured by applying compressive force at a rate of about 1 mm/min using a universal testing machine (UTM).

In exemplary embodiments, the molded article may be a reflector and/or reflector cup for LEDs.

DETAILED DESCRIPTION

Hereinafter, embodiments of the present invention will be described in detail.

It should be understood that the following embodiments are provided for complete disclosure and thorough understanding of the invention by those skilled in the art. In addition, unless otherwise stated, technical and scientific terms as used herein have a meaning generally understood by those skilled in the art. Descriptions of known functions and constructions which may unnecessarily obscure the subject matter of the present invention will be omitted.

A thermoplastic resin composition according to the present invention includes: (A) a polyester resin; (B) a white pigment; (C) a core-shell structured impact modifier; and (D) a modified polyolefin resin.

(A) Polyester Resin

According to exemplary embodiments of the present invention, the polyester resin can enhance heat resistance, mechanical strength, and/or impact resistance of the thermoplastic resin composition even at high temperature.

In exemplary embodiments, the polyester resin may be an aromatic polyester resin. The aromatic polyester resin is a polymer which includes a ring-shaped structure and thus has a high melting point. The aromatic polyester resin may have a melting point of about 200° C. or higher, for example, about 220° C. to about 380° C., and as another example about 260° C. to about 320° C. In exemplary embodiments, the aromatic polyester resin may be a resin obtained by polycondensation of a dicarboxylic acid component including an aromatic dicarboxylic acid and/or a derivative thereof with a $C_2$ to $C_{22}$ diol component.

In exemplary embodiments, the dicarboxylic acid component may include terephthalic acid, isophthalic acid, phthalic acid, and naphthalene dicarboxylic acid, without being limited thereto. These may be used alone or in combination thereof.

In exemplary embodiments, the diol component may include an alicyclic diol to form a ring-shaped repeat unit. For example, the alicyclic diol may include a $C_5$ to $C_{22}$ cycloaliphatic diol, such as but not limited to 1,4-cyclohexanedimethanol (CHDM) and the like. The alicyclic diol may have trans/cis isomer ratio of about 2.3 to about 10, for example, about 2.5 to about 5. Within this range, the polyester resin can have excellent heat resistance, and the thermoplastic resin composition can exhibit excellent moldability, mechanical properties, discoloration resistance, and/or photostability.

In addition to the alicyclic diol, the diol component may further optionally include ethylene glycol (EG), which is an aliphatic diol. When the diol component includes ethylene glycol, the ethylene glycol may be present in an amount of 85 wt % or less, for example, about 20 wt % to about 70 wt % based on the total weight (100 wt %) of the diol component. In some embodiments, the diol component may include ethylene glycol in an amount of 0 (ethylene glycol is not present), about 0 (ethylene glycol is present), 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, or 85 wt %. Further, according to some embodiments of the present invention, the amount of ethylene glycol can be in a range from about any of the foregoing amounts to about any other of the foregoing amounts.

Within this range, the diol component can enhance impact resistance of the polyester resin with minimal or no deterioration in heat resistance of the polyester resin.

In addition to the alicyclic diol, the diol component may further optionally include a $C_6$ to $C_{21}$ aromatic diol, a $C_3$ to $C_8$ aliphatic diol, or a mixture thereof. Examples of the $C_6$ to $C_{21}$ aromatic diol may include 2,2-bis-(3-hydroxyethoxyphenyl)-propane and 2,2-bis-(4-hydroxypropoxyphenyl)-propane, and examples of the $C_3$ to $C_8$ aliphatic diol may include propane-1,3-diol, butane-1,4-diol, pentane-1,5-diol, hexane-1,6-diol, 3-methylpentane-2,4-diol, 2-methylpentane-1,4-diol, 2,2,4-trimethylpentane-1,3-diol, 2-ethylhexane-1,3-diol, and 2,2-diethylpropane-1,3-diol, without being limited thereto. These may be used alone or in combination thereof.

The $C_6$ to $C_{21}$ aromatic diol, the $C_3$ to $C_8$ aliphatic diol, or the mixture thereof may be present in an amount of about 3 wt % or less based on the total weight (100 wt %) of the diol component. In some embodiments, the diol component may include the $C_6$ to $C_{21}$ aromatic diol and/or $C_3$ to $C_8$ aliphatic diol in an amount of 0 (the $C_6$ to $C_{21}$ aromatic diol and/or $C_3$ to $C_8$ aliphatic diol is not present), about 0 (the $C_6$ to $C_{21}$ aromatic diol and/or $C_3$ to $C_8$ aliphatic diol is present), 1, 2, or 3 wt %. Further, according to some embodiments of the present invention, the amount of the $C_6$ to $C_{21}$ aromatic diol and/or $C_3$ to $C_8$ aliphatic diol can be in a range from about any of the foregoing amounts to about any other of the foregoing amounts.

Examples of the polyester resin may include without limitation a polyethylene terephthalate resin, a polytrimethylene terephthalate resin, a polybutylene terephthalate resin, a polyhexamethylene terephthalate resin, a polycyclohexane dimethylene terephthalate resin, and an amorphous modified polyester resin thereof These may be used alone or as a mixture thereof One example of the mixture may include a mixture of a polyethylene terephthalate resin and a polybutylene terephthalate resin.

In some embodiments, the polyester resin may include a repeat unit represented by Formula 1.

[Formula 1]

In Formula 1, Ar is a $C_6$ to $C_{18}$ arylene group, $R_1$ and $R_3$ are the same or different and are each independently a $C_1$ to $C_{10}$ linear alkylene group, and $R_2$ is a $C_3$ to $C_{12}$ cyclic alkylene group. Here, $R_1$, $R_2$, and $R_3$ are derived from an alicyclic diol and may have a total carbon number of 5 to 22.

In exemplary embodiments, the polyester resin may include a polycyclohexylenedimethylene terephthalate (PCT) resin represented by Formula 2, without being limited thereto.

[Formula 2]

In Formula 2, m is an integer from 10 to 500.

In exemplary embodiments, the (A) polyester resin may have an intrinsic viscosity [η] of about 0.4 dl/g to about 1.5 dl/g, for example, about 0.5 dl/g to about 1.2 dl/g, as measured at about 35° C. using an o-chlorophenol solution (concentration: about 0.5 g/dl). Within this range, the polyester resin composition can exhibit excellent mechanical properties and/or moldability.

In exemplary embodiments, the polyester resin may be prepared by a polycondensation method known in the art. For example, the polycondensation method may include direct condensation of an acid through transesterification using a glycol or a low grade alkyl ester, without being limited thereto.

In exemplary embodiments, the polyester resin may have a weight average molecular weight of about 3,000 g/mol to about 30,000 g/mol, for example, about 5,000 g/mol to about 20,000 g/mol, as measured by gel permeation chromatography (GPC). Within this range, the composition can exhibit excellent moldability and mechanical properties.

(B) White Pigment

According to exemplary embodiments of the present invention, the white pigment can enhance whiteness and/or reflectance of the polyester resin composition, and/or can improve discoloration resistance and/or photostability of the composition even under high temperature conditions through combination with other components. The white pigment may include any typical white pigments without limitation. Examples of the white pigment may include without limitation titanium oxide, zinc oxide, zinc sulfide, white lead (2PbCO$_3$.Pb(OH)$_2$), zinc sulfate, barium sulfate, calcium carbonate, alumina, and the like. These may be used alone or in combination thereof.

In exemplary embodiments, the white pigment may include titanium oxide, which can exhibit high whiteness, high light reflectance, high dispersibility, excellent weather resistance, and/or chemical stability through combination with other components. Titanium oxide can have any crystal structure without limitation. In exemplary embodiments, titanium oxide can have a rutile and/or tetragonal crystal structure, which can be stable upon exposure to high temperature for a long time and/or can effectively prevent deterioration in reflectance of the polyester resin composition.

In exemplary embodiments, the white pigment may have an average particle diameter about 0.01 μm to about 2.0 μm, for example, about 0.05 μm to about 0.7 μm. Within this range, the resin composition can exhibit excellent properties in terms of whiteness, reflectance, and the like.

In exemplary embodiments, the white pigment may be subjected to surface treatment with an organic surface treatment agent and/or an inorganic surface treatment agent. Examples of the organic surface treatment agent may include without limitation silane coupling agents, polydimethylsiloxane, trimethylolpropane (TMP), pentaerythritol, and the like. These may be used alone or in combination thereof. Examples of the silane coupling agents may include without limitation vinyltriethoxysilane, 2-aminopropyltriethoxysilane, 2-glycidoxypropyltriethoxysilane, and the like. Examples of the inorganic surface treatment agents may include without limitation aluminum oxide (alumina, Al$_2$O$_3$), silicon dioxide (silica, SiO$_2$), zirconia (zirconium dioxide, ZrO$_2$), sodium silicate, sodium aluminate, sodium aluminum silicate, zinc oxide, mica, and the like. These may also be used alone or in combination thereof. Upon surface treatment, the organic and/or inorganic surface treatment agent may be present in an amount of less than 5 parts by weight based on about 100 parts by weight of the white pigment. Within this range, the resin composition can exhibit further enhanced whiteness and/or reflectance.

A base resin according to the present invention includes the polyester resin and the white pigment, wherein a weight ratio of the polyester resin to the white pigment may range from about 0.1:1 to about 10:1, for example, about 2:1 to about 10:1. Within this range, the base resin can exhibit excellent heat resistance, moldability, mechanical properties, discoloration resistance, and/or photostability.

(C) Core-shell Structured Impact Modifier

According to exemplary embodiments of the present invention, the core-shell structured impact modifier can improve interface properties of the base resin, together with the modified polyolefin resin, thereby enhancing reflectance, reflectance maintenance at high temperature, and/or flexural strength of the thermoplastic resin composition. The core-shell structured impact modifier may be obtained by grafting a shell component to a core (rubber core) to form a shell.

In exemplary embodiments, the core component may include a silicon compound, an acrylic compound, or a mixture thereof.

In exemplary embodiments, the silicon compound may include a cyclosiloxane compound, for example, hexamethylcyclotrisiloxane, octamethylcyclotetrasiloxane, decamethylcyclopentasiloxane, dodecamethylcyclohexasiloxane, trimethyltriphenylcyclotrisiloxane, tetramethyltetraphenylcyclotetrasiloxane, octaphenylcyclotetrasiloxane, and the like, and combinations thereof, without being limited thereto. Further, the silicon compound may also be used together with a curing agent such as trimethoxymethylsilane, triethoxyphenylsilane, tetramethoxysilane, and/or tetraethoxysilane.

Examples of the acrylic compound may include without limitation (meth)acrylic acid, esters thereof, alkyl ethacrylates, and the like, and combinations thereof. Examples of the acrylic compound may include without limitation methyl (meth)acrylate, ethyl (meth)acrylate, butyl (meth)acrylate, 2-ethylbutyl (meth)acrylate, 2-ethylhexyl (meth)acrylate, hexyl (meth)acrylate, heptyl (meth)acrylate, octyl (meth)acrylate, n-pentyl (meth)acrylate, vinyl (meth)acrylate, lauryl (meth)acrylate, methyl ethacrylate, ethyl ethacrylate, and the like, and combinations thereof.

As used herein, unless otherwise stated, the term "(meth) acrylic acid" includes "acrylic acid" and "methacrylic acid", and the term "(meth)acrylate" includes "acrylate" and "methacrylate".

In exemplary embodiments, the core may be a polymer (rubbery polymer) of the silicon compound, a polymer (rubbery polymer) of the acrylic compound, or a copolymer (rubbery polymer) of the silicon compound and the acrylic compound. The rubbery polymer (rubber) may have an average particle diameter about 0.1 μm to about 1 μm. Within this range, the thermoplastic resin composition can exhibit excellent impact resistance and/or gloss.

In exemplary embodiments, the shell component grafted to the core may include an unsaturated compound. Examples of the unsaturated compound may include without limitation an acrylic compound, an aromatic vinyl compound, a vinyl cyanide compound, a heterocyclic compound, and the like, and combinations thereof.

In exemplary embodiments, the acrylic compound may be the same as the acrylic compound included in the core component, and examples thereof may include without limitation (meth)acrylic acid, esters thereof, alkyl ethacrylates, and the like, and combinations thereof. Examples of the acrylic compound may include without limitation methyl (meth)acrylate, ethyl (meth)acrylate, butyl (meth)acrylate, 2-ethylbutyl (meth)acrylate, 2-ethylhexyl (meth)acrylate, hexyl (meth)acrylate, heptyl (meth)acrylate, octyl (meth)acrylate, n-pentyl (meth)acrylate, vinyl (meth)acrylate, lauryl (meth)acrylate, methyl ethacrylate, ethyl ethacrylate, and the like, and combinations thereof.

In exemplary embodiments, the aromatic vinyl compound may include styrene, $C_1$ to $C_{10}$ alkyl substituted styrene, halogen substituted styrene, and the like, and combinations thereof, without being limited thereto. Examples of the alkyl substituted styrene may include without limitation o-ethyl styrene, m-ethyl styrene, p-ethyl styrene, α-methyl styrene, and the like, and combinations thereof.

In exemplary embodiments, the vinyl cyanide compound may include acrylonitrile, methacrylonitrile, ethacrylonitrile, and the like, and combinations thereof, without being limited thereto.

In exemplary embodiments, the heterocyclic compound may include maleic anhydride, C1-C10 alkyl and/or phenyl N-substituted maleimide, and the like, and combinations thereof, without being limited thereto.

In exemplary embodiments, in the core-shell structured impact modifier, the core may be present in an amount of about 20 wt % to about 99 wt %, for example, about 50 wt % to about 95 wt %, and the shell may be present in an amount of about 1 wt % to about 80 wt %, for example, about 5 wt % to about 50 wt %. Within this range, the thermoplastic resin composition may exhibit excellent properties in terms of impact resistance and the like.

In exemplary embodiments, the thermoplastic resin composition may include the core-shell structured impact modifier in an amount of about 0.01 parts by weight to about 15 parts by weight, for example, about 1 part by weight to about 10 parts by weight, based on about 100 parts by weight of the base resin. In some embodiments, the thermoplastic resin composition may include the core-shell structured impact modifier in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, 10, 11, 12, 13, 14, or 15 parts by weight. Further, according to some embodiments of the present invention, the amount of the core-shell structured impact modifier can be in a range from about any of the foregoing amounts to about any other of the foregoing amounts.

Within this range, the core-shell structured impact modifier can improve impact resistance, weather resistance, and/or package flexural strength of the thermoplastic resin composition.

(D) Modified Polyolefin Resin

The modified polyolefin resin is obtained by imparting a polar group to non-polar polyolefin, and can enhance, together with the core-shell structured impact modifier and the like, reflectance, reflectance maintenance at high temperature, and/or flexural strength of the thermoplastic resin composition.

In exemplary embodiments, the modified polyolefin resin may be a copolymer of a monomer mixture including an olefin such as ethylene, a-olefin, and the like, and a comonomer including at least one oxygen atom capable of forming a copolymer together with the olefin. Examples of the comonomer may include without limitation (meth)acrylic acid; alkyl (meth)acrylates such as methyl (meth)acrylate, ethyl (meth)acrylate, butyl (meth)acrylate, hexyl (meth)acrylate, 2-ethylhexyl (meth)acrylate, dodecyl (meth)acrylate, cyclohexyl (meth)acrylate, and the like; ethylenically unsaturated group-containing modified esters such as glycidyl (meth)acrylate; aryl (meth)acrylates such as benzyl (meth)acrylate; vinyl acetate; vinyl alcohol; maleic anhydride, and the like, and combinations thereof. The modified polyolefin resin may be a copolymer of a monomer mixture further including an aromatic vinyl monomer such as styrene and/or a diene monomer, in addition to the olefin and the comonomer including at least one oxygen atom.

Examples of the modified polyolefin resin may include without limitation ethylene-vinyl acetate (EVA) copolymers; acid and/or anhydride modified ethylene-vinyl acetate copolymers; ethylene-alkyl (meth)acrylate copolymers such as ethylene-methyl acrylate (EMA) copolymer, ethylene-ethyl acrylate (EEA), ethylene-butyl acrylate (EBA) copolymer, and the like; ethylene-glycidyl (meth)acrylate copolymers; ethylene-glycidyl (meth)acrylate-alkyl acrylate terpolymers; ethylene-vinyl alcohol copolymers; ethylene-hydroxyalkyl (meth)acrylate copolymers; ethylene-acrylic acid copolymers; acid and/or anhydride modified polyethylene; styrene-ethylene-butadiene-styrene (SEBS) copolymers; ethylene-propylene-diene monomer (EPDM) rubber; and the like, and combinations thereof.

In exemplary embodiments, the modified polyolefin resin may be a maleic acid modified polyolefin resin obtained by grafting maleic anhydride to a polyolefin resin to impart a polar group thereto. The maleic acid modified polyolefin resin may be prepared by a reactive extrusion process in which, using a twin screw extruder, peroxide is added to high density polyethylene (HDPE) having a melt-flow index (MI) of about 10 g/10 min to about 50 g/10 min to break ethylene bonds and generate free radicals, thereby introducing maleic anhydride (MAH) into the ethylene bonds.

In exemplary embodiments, the modified polyolefin resin may include the olefin in an amount of about 40 wt % to about 99 wt %, for example, about 50 wt % to about 98 wt %, and as another example about 60 wt % to about 95 wt %, based on the total weight (100 wt %) of the modified olefin resin. Within this range, the thermoplastic resin composition can exhibit enhanced properties in terms of reflectance, mechanical strength, and the like.

In exemplary embodiments, the thermoplastic resin composition can include the modified polyolefin resin in an amount of about 0.01 parts by weight to about 10 parts by weight, for example about 0.1 parts by weight to about 5 parts by weight, based on about 100 parts by weight of the base resin. In some embodiments, the thermoplastic resin composition may include the modified polyolefin resin in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, or 10 parts by weight. Further, according to some embodiments of the present invention, the amount of the modified polyolefin resin can be in a range from about any of the foregoing amounts to about any other of the foregoing amounts.

Within this range, the modified polyolefin resin can enhance reflectance maintenance at high temperature and/or package flexural strength of the thermoplastic resin composition.

In exemplary embodiments, the weight ratio of the core-shell structured impact modifier to the modified polyethylene may range from about 0.05:1 to about 20:1, for example, about 1:1 to about 20:1. Within this range, the thermoplastic resin composition can exhibit further enhanced reflectance, reflectance maintenance at high temperature, and/or flexural strength.

The thermoplastic resin composition according to one embodiment of the invention may further include inorganic filler in the base resin.

According to the present invention, the inorganic filler can improve mechanical strength of the thermoplastic resin composition, and may include any inorganic filler known in the art. For example, the inorganic fillers may have a cross-section of various shapes, such as a circular shape, elliptical shape, and/or rectangular shape, and the like.

Examples of the inorganic fillers may include without limitation glass fibers, carbon fibers, glass beads, glass flakes, carbon black, clay, kaolin, talc, mica, wollastonite, and the like, and combinations thereof In view of mechanical properties, in exemplary embodiments, the inorganic fillers can include glass fibers.

In exemplary embodiments, the glass fibers may include circular glass fibers and/or glass fibers having a flake shape in cross-section. The circular glass fibers may have a cross-sectional diameter of about 5 μm to about 20 μm and a pre-processing length of about 2 mm to about 5 mm. The flake glass fibers may have a cross-sectional aspect ratio of about 1.5 to about 10 and a pre-processing length of about 2 μm to about 5 μm. When such inorganic fillers are used, the resin composition can exhibit improved processability and a molded article can exhibit significantly improved mechanical properties such as flexural strength, impact strength, and the like.

In exemplary embodiments, the inorganic fillers may be subjected to surface coating with a surface treatment agent to increase coupling force to the polyester resin. Examples of the surface treatment agent may include silane compounds, urethane compounds, and/or epoxy compounds, without being limited thereto.

In addition, the inorganic fillers may be used as a nucleating agent. For example, when the polyester resin composition further includes talc as the nucleating agent, the polyester resin composition has faster solidification time upon injection molding due to faster crystallization rate thereof, and can exhibit improved mechanical properties in terms of flexural strength.

In exemplary embodiments, the thermoplastic resin composition can include inorganic filler may be present in an amount of about 1 wt % to about 40 wt %, for example, about 10 wt % to about 20 wt %, based on the total weight of the base resin. In some embodiments, the thermoplastic resin composition may include the inorganic filler in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the inorganic filler can be in a range from about any of the foregoing amounts to about any other of the foregoing amounts.

Within this range, the inorganic fillers can enhance mechanical properties, heat resistance, and/or moldability of the resin composition with minimum or no deterioration of other properties thereof.

According to exemplary embodiments of the present invention, the resin composition may further include one or more typical additives without affecting intended effects of the invention, as needed. Examples of the additives may include antibacterial agents, heat stabilizers, antioxidants, releasing agents, photostabilizers, inorganic additives, surfactants, coupling agents, plasticizers, compatibilizers, lubricants, antistatic agents, colorants, pigments, dyes, flame retardants, flame retardant aids, anti-dripping agents, weather resistance stabilizers, UV absorbers, UV blocking agents, and the like, and mixtures thereof, without being limited thereto.

In exemplary embodiments, examples of the antioxidants may include phenol, amine, sulfur, and/or phosphorus antioxidants; examples of the heat stabilizers may include lactone, hydroquinone, halogenated copper, and/or iodine compounds; and examples of the flame retardants may include bromine, chlorine, phosphorus, antimony, and/or inorganic compounds, without limitation.

The additives may be present in a proper amount with minimal or no effect on properties of the polyester resin composition. In exemplary embodiments, the additives may be present in an amount of about 20 parts by weight or less, for example, about 0.1 parts by weight to about 15 parts by weight, based on about 100 parts by weight of the base resin.

The thermoplastic resin composition according to the present invention may be prepared by a method known in the art. For example, the above components and, optionally, other additives can be mixed using a Henschel mixer, a V blender, a tumbler blender, or a ribbon blender, followed by melt extrusion at about 150° C. to about 350° C. in a single screw extruder or a twin screw extruder, thereby preparing a resin composition in pellet form. For example, the mixture of the components and the additive(s) can be subjected to extrusion under conditions of a temperature of about 250° C. to about 310° C., a screw rotating speed of about 300 rpm to about 600 rpm, and a self-feeding rate of about 60 kg/hr to about 600 kg/hr using a twin screw extruder with L/D of about 29 and ϕ of about 36 mm, thereby preparing a polyester resin composition in pellet form.

A molded article according to the present invention is formed of the thermoplastic resin composition according to the present invention. For example, the molded article may be manufactured using the thermoplastic resin composition by a molding method known in the art, such as injection molding, dual injection molding, blow molding, extrusion, thermoforming, and the like. The molded article formed of the thermoplastic resin composition can exhibit high reflectance and, particularly, excellent reflectance maintenance at high temperature while exhibiting excellent flexural strength.

In exemplary embodiments, the molded article may have a difference in reflectance of about less than about 15, for example, about 1 to about 10, as measured before/after light irradiation (LED light source, wavelength of about 450 nm) in a constant temperature/humidity oven at about 170° C. and about 85% RH for about 1,000 hours, and a flexural strength at break point of about 20 N to about 80 N, for example, about 25 N to about 60 N, as measured by applying compressive force at a rate of about 1 mm/min using a universal testing machine (UTM).

The molded article formed of the thermoplastic resin composition according to the present invention can exhibit considerably enhanced mechanical strength including flexural strength and realize excellent reflectance through combination of the base resin, the core-shell structured impact modifier, and the modified polyolefin resin. Thus, the molded article can be used for light reflection without limitation. For example, the molded article is useful as a reflector for a light emitting device of electrical/electronic components, indoor/outdoor illumination devices, automotive lighting devices, displays, and the like, particularly, a reflector or reflector cup for LEDs.

Figure 1:
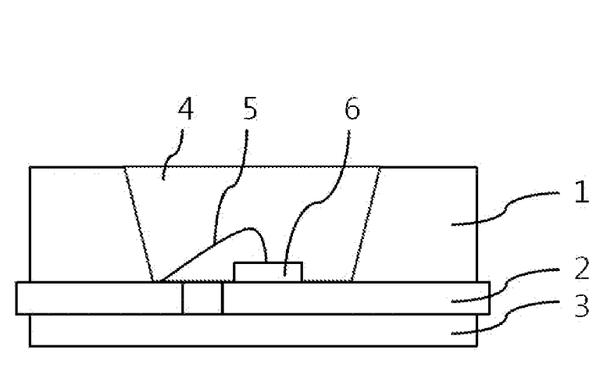
FIG. 1 is a sectional view of a semiconductor device including a reflector cup formed from a thermoplastic resin composition according to an exemplary embodiment of the present invention.

FIG. 1 is a sectional view of a semiconductor device (package) including a reflector cup formed from a thermoplastic resin composition according to one embodiment of the invention. As shown in FIG. 1, the thermoplastic resin composition according to the invention may be formed into a reflector or reflector cup 1 of various shapes, and the prepared reflector cup 1 may be assembled with various known electrodes 2, substrates 3, sealing resins 4, wires 5, and light emitting diodes (LEDs) 6 to form products including light emitting diodes (LEDs) or organic light emitting diodes (OLEDs), such as semiconductor devices, illumination devices, and the like. In addition, the constitution as set forth above can be modified and changed in various ways by those skilled in the art.

Hereinafter, the present invention will be described in more detail with reference to the following examples. It should be understood that these examples are provided for illustration only and are not to be construed in any way as limiting the present invention.

EXAMPLES

Details of components used in the following Examples and Comparative Examples are as follows:

(A) Polyester Resin

Polycyclohexylenedimethylene terephthalate (PCT) resin (PCT0302, SK Chemical) is used.

(B) White Pigment

Titanium oxide (SAOMAI SM 2S15, Wooshin Pigment Co., Ltd.) is used.

(C) Core-shell Structured Impact Modifier (C1) A core-shell structured impact modifier obtained by grafting methyl (meth)acrylate to a butylacrylate rubber core available from MRC Co., Ltd. (average particle diameter: 150 μm to 250 μm) to form a shell is used.

(C2) A core-shell structured impact modifier obtained by grafting methyl (meth)acrylate to a polydimethylsiloxane rubber core available from MRC Co., Ltd. (average particle diameter: 150 μm to 250 μm) to form a shell is used.

(D) Modified Polyolefin Resin

An ethylene-methylacrylate (EMA) copolymer having an ethylene content of 70 wt % is used.

(E) Glass Fiber

A glass fiber having a circular section, a sectional diameter of 10 μm, and an average length of 3 mm (910, Owens Corning Co., Ltd.) is used.

Example 1

As listed in Table 1, 100 parts by weight of a base resin including 75 wt % of the (A) polyester resin and 25 wt % of the (B) white pigment, 3 parts by weight of the (C1) core-shell structured impact modifier, and 0.2 parts by weight of the (D) modified polyolefin resin are subjected to dry blending to prepare a thermoplastic resin composition. Then, the thermoplastic resin composition is subjected to extrusion at a nozzle temperature of 250° C. to 350° C. using a twin screw extruder (φ=45 mm), thereby preparing pellets. The prepared pellets are dried at 100° C. for 4 hours or more, followed by injection molding, thereby preparing a specimen. The prepared specimen is evaluated as to reflectance, difference in reflectance, and flexural strength by the following methods. Results are shown in Table 2.

Example 2

As listed in Table 1, 100 parts by weight of a base resin including 60 wt % of the (A) polyester resin, 20 wt % of the (B) white pigment, and 20 wt % of the (E) glass fiber, 3 parts by weight of the (C1) core-shell structured impact modifier, and 0.2 parts by weight of the (D) modified polyolefin resin are subjected to dry blending to prepare a thermoplastic resin composition. Then, the thermoplastic resin composition is subjected to extrusion at a nozzle temperature of 250° C. to 350° C. using a twin screw extruder (φ=45 mm), thereby preparing pellets. The prepared pellets are dried at 100° C. for 4 hours or more, followed by injection molding, thereby preparing a specimen. The prepared specimen is evaluated as to reflectance, difference in reflectance, and flexural strength by the following methods. Results are shown in Table 2.

Example 3

As listed in Table 1, 100 parts by weight of a base resin including 60 wt % of the (A) polyester resin, 20 wt % of the (B) white pigment, and 20 wt % of the (E) glass fiber, 3 parts by weight of the (C1) core-shell structured impact modifier, and 0.5 parts by weight of the (D) modified polyolefin resin are subjected to dry blending to prepare a thermoplastic resin composition. Then, the thermoplastic resin composition is subjected to extrusion at a nozzle temperature of 250° C. to 350° C. using a twin screw extruder (φ=45 mm), thereby preparing pellets. The prepared pellets are dried at 100° C. for 4 hours or more, followed by injection molding, thereby preparing a specimen. The prepared specimen is evaluated as to reflectance, difference in reflectance, and flexural strength in by the following methods. Results are shown in Table 2.

Example 4

As listed in Table 1, 100 parts by weight of a base resin including 60 wt % of the (A) polyester resin, 20 wt % of the (B) white pigment, and 20 wt % of the (E) glass fiber, 3 parts by weight of the (C2) core-shell structured impact modifier, and 0.5 parts by weight of the (D) modified polyolefin resin are subjected to dry blending to prepare a thermoplastic resin composition. Then, the thermoplastic resin composition is subjected to extrusion at a nozzle temperature of 250° C. to 350° C. using a twin screw extruder (φ=45 mm), thereby preparing pellets. The prepared pellets are dried at 100° C. for 4 hours or more, followed by injection molding, thereby preparing a specimen. The prepared specimen is evaluated as to reflectance, difference in reflectance, and flexural strength in by the following methods. Results are shown in Table 2.

Example 5

Preparation of a specimen and testing are performed in the same manner as in Example 2 except that the (C1) core-shell structured impact modifier is used in an amount of 18 parts by weight based on 100 parts by weight of the base resin.

Example 6

Preparation of a specimen and testing are performed in the same manner as in Example 2 except that the (D) modified polyolefin resin is used in an amount of 12 parts by weight based on 100 parts by weight of the base resin.

Comparative Example 1

Preparation of a specimen and testing are performed in the same manner as in Example 3 except that the (D) modified polyolefin resin is not included.

Comparative Example 2

Preparation of a specimen and testing are performed in the same manner as in Example 3 except that the (C1) core-shell structured impact modifier is not included.

Property Evaluation

1) Measurement of reflectance (unit: %) and difference in reflectance: Reflectance (specular component included (SCI) mode) upon light irradiation at a wavelength of 450 nm (LED light source) is measured on a plate type specimen. As a reflectometer, 3600 CIE Lab available from Konica Minolta Holdings, Inc. is used. In addition, after measuring reflectance of the specimen, the specimen is placed in a constant temperature/humidity oven at 170° C. and 85% RH, followed by light irradiation (LED light source, wavelength of 450 nm) for 1,000 hours and then measuring reflectance after light irradiation under constant temperature/humidity conditions, thereby calculating decrement (difference) in reflectance.

2) Measurement of package flexural strength (unit: N): With a 7032 (16 cavity) mold mounted on an injection molding machine, a metal LED lead frame is insert molded to prepare a molded article. The prepared molded article is cut into a single piece (specimen) using a hand cutter, followed by measuring compressive strength at a rate of about 1 mm/min using a universal testing machine (UTM), thereby finding a flexural strength at break point.

TABLE 1

| Item | Example 1 | Example 2 | Example 3 | Example 4 | Example 5 | Example 6 | Comparative Example 1 | Comparative Example 2 |
|---|---|---|---|---|---|---|---|---|
| (A) Polyester resin (wt %) | 75 | 60 | 60 | 60 | 60 | 60 | 60 | 60 |
| (B) White pigment (wt %) | 25 | 20 | 20 | 20 | 20 | 20 | 20 | 20 |
| (E) Glass fiber (wt %) | 0 | 20 | 20 | 20 | 20 | 20 | 20 | 20 |
| (C1) Core-shell structured impact modifier (parts by weight) | 3 | 3 | 3 | — | 18 | 3 | 3 | — |
| (C2) Core-shell structured impact modifier (parts by weight) | — | — | — | 3 | — | — | — | — |
| (D) Modified polyolefin resin (parts by weight) | 0.2 | 0.2 | 0.5 | 0.5 | 0.2 | 12 | — | 0.5 |

Parts by weight: Based on 100 parts by weight of base resin (A + B + E)

TABLE 2

| Item | | Example 1 | Example 2 | Example 3 | Example 4 | Example 5 | Example 6 | Comparative Example 1 | Comparative Example 2 |
|---|---|---|---|---|---|---|---|---|---|
| Reflectance (%) | Before constant temperature/humidity testing | 94.9 | 94.0 | 94.4 | 94.2 | 94.7 | 94.4 | 93.1 | 93.2 |
| | After constant temperature/humidity testing | 87.1 | 85.8 | 86.5 | 86.4 | 86.9 | 85.4 | 74.8 | 75.7 |
| | Difference in reflectance | 7.8 | 8.2 | 7.9 | 7.8 | 7.8 | 9.0 | 18.3 | 17.5 |
| Package flexural strength (N) | | 29 | 46 | 53 | 52 | 34 | 38 | 35 | 32 |

From the results of Example 1 in Table 2, it can be seen that the thermoplastic resin composition according to the present invention exhibits similar flexural strength to Comparative Examples 1 to 2 despite not including glass fibers, has relatively high reflectance as compared with Comparative Examples 1 to 2, and exhibits a relatively small difference in reflectance before/after constant temperature/humidity testing and thus excellent reflectance maintenance properties at high temperature, as compared with those of Comparative Examples 1 to 2. In addition, from the results of Examples 2 to 4 in Table 2, it can be seen that the thermoplastic resin composition according to the present invention exhibits excellent properties in terms of reflectance, reflectance maintenance at high temperature, and package flexural strength, when further including inorganic fillers such as glass fibers.

Although some embodiments have been described herein, it should be understood that these embodiments are provided for illustration only and are not to be construed in any way as limiting the present invention, and that various modifications, changes, alterations, and equivalent embodiments can be made by those skilled in the art without departing from the spirit and scope of the invention. Therefore, the scope of the present invention should be defined by the appended claims and equivalents thereof.

What is claimed is:

1. A thermoplastic resin composition comprising:
   a polyester resin, wherein the polyester resin is polycyclohexylenedimethylene terephthalate (PCT) resin;
   a white pigment, wherein the white pigment is titanium oxide;
   a core-shell structured impact modifier, wherein the core-shell structured impact modifier is obtained by grafting methyl (meth)acrylate to a polydimethylsiloxane rubber core; and
   a modified polyolefin resin, wherein the modified polyolefin resin is an ethylene-methacrylate copolymer,
   wherein the composition comprises about 1 parts by weight to about 10 parts by weight of the core-shell structured impact modifier and about 0.1 parts by weight to about 1 part by weight of the modified polyolefin resin, each based on about 100 parts by weight of a base resin including the polyester resin and the white pigment,
   wherein the amounts of the core-shell structured impact modifier and the modified polyolefin are selected to provide a weight ratio of the core-shell structured impact modifier and the modified polyolefin resin of 6:1 to about 20:1, and a weight ratio of the polyester resin to the white pigment ranges from about 0.1:1 to about 10:1.

2. The thermoplastic resin composition according to claim 1, wherein the base resin further comprises inorganic filler.

3. The thermoplastic resin composition according to claim 2, wherein the inorganic filler is present in an amount of about 1 wt % to about 40 wt % based on a total weight of the base resin.

4. The thermoplastic resin composition according to claim 2, wherein the inorganic filler comprises glass fibers, carbon fibers, glass beads, glass flakes, carbon black, clay, kaolin, talc, mica, and/or wollastonite.

5. A molded article formed from the thermoplastic resin composition according to claim 1, wherein the molded article has a difference in reflectance of about less than about 15%, as measured before/after light irradiation (LED light source, wavelength of about 450 nm) of a plate specimen in a constant temperature/humidity oven at about 170° C. and about 85% relative humidity (RH) for about 1,000 hours.

6. The molded article according to claim 5, wherein the molded article is a reflector or reflector cup for a LED.

7. The molded article according to claim 5, wherein the molded article is a reflector cup for a LED.

8. The thermoplastic resin composition according to claim 1, wherein the weight ratio of the core-shell structured impact modifier and the modified polyolefin resin ranges from 6:1 to 15:1.

9. The molded article according to claim 5, wherein the molded article has a difference in reflectance of 8.2% or less measured before/after light irradiation (LED light source, wavelength of about 450 nm) of a plate specimen in a constant temperature/humidity oven at about 170° C. and about 85% relative humidity (RH) for about 1,000 hours.

10. The molded article according to claim 5, wherein the molded article has a difference in reflectance of about 1 to about 10, as measured before/after light irradiation (LED light source, wavelength of about 450 nm) of a plate specimen in a constant temperature/humidity oven at about 170° C. and about 85% relative humidity (RH) for about 1,000 hours.

* * * * *